(12) United States Patent
Suzuki et al.

(10) Patent No.: US 8,029,227 B2
(45) Date of Patent: Oct. 4, 2011

(54) DUST RESISTANT LOAD PORT APPARATUS AND MINI-ENVIRONMENT SYSTEM

(75) Inventors: Hitoshi Suzuki, Tokyo (JP); Toshihiko Miyajima, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 12/815,727

(22) Filed: Jun. 15, 2010

(65) Prior Publication Data

US 2010/0254786 A1   Oct. 7, 2010

Related U.S. Application Data

(63) Continuation of application No. 11/736,357, filed on Apr. 17, 2007, now Pat. No. 7,748,942.

(30) Foreign Application Priority Data

May 31, 2006   (JP) .................................. 2006-151570

(51) Int. Cl.
*B65G 49/07* (2006.01)

(52) U.S. Cl. ....................... 414/411; 414/217.1; 414/939

(58) Field of Classification Search .................. 414/217, 414/217.1, 411, 939; 141/51, 63
See application file for complete search history.

(56) References Cited

U.S. PATENT DOCUMENTS

| | | | |
|---|---|---|---|
| 5,169,272 A | 12/1992 | Bonora et al. | |
| 6,398,475 B1 | 6/2002 | Ishikawa | |
| 7,416,998 B2 | 8/2008 | Kisakibaru et al. | |
| 7,537,425 B2 | 5/2009 | Okabe et al. | |
| 7,670,095 B2 * | 3/2010 | Okabe et al. ................ | 414/217.1 |
| 7,726,353 B2 * | 6/2010 | Okabe ........................... | 414/217 |
| 7,789,609 B2 * | 9/2010 | Okabe et al. .................. | 414/217 |
| 7,841,371 B2 * | 11/2010 | Okabe ........................... | 414/217 |
| 2005/0201854 A1 | 9/2005 | Kisakibaru | |
| 2005/0265812 A1 | 12/2005 | Suzuki et al. | |

FOREIGN PATENT DOCUMENTS

| | | |
|---|---|---|
| JP | 10-242016 | 9/1998 |
| JP | 2002-373927 | 12/2002 |
| JP | 3581310 | 7/2004 |

* cited by examiner

*Primary Examiner* — James Keenan (74) *Attorney, Agent, or Firm* — Oblon, Spivak, McClelland, Maier & Neustadt, L.L.P.

(57) ABSTRACT

In a load port apparatus, a clearance is formed between an inner circumferential surface of an opening of the chamber and an outer circumferential surface of a door. The area of the clearance between the plate and the opening portion on a plane flush with an interior side of the chamber is larger than the area of the clearance between the plate and the opening portion on a plane flush with the exterior of the chamber. A fan located at an upper side of the chamber generates a first flow of air in the downward direction. The clearance generates a second flow of air from the interior of the chamber to the exterior of the chamber. The second flow of air is generated by the difference in the area of the interior cross section of the clearance and area of the exterior cross section of the clearance.

10 Claims, 8 Drawing Sheets

DUST RESISTANT LOAD PORT APPARATUS AND MINI-ENVIRONMENT SYSTEM

CROSS-REFERENCE TO RELATED APPLICATIONS

This application is a continuation of U.S. application Ser. No. 11/736,357, filed Apr. 17, 2007, now issued as U.S. Pat. No. 7,748,942 on Jul. 6, 2010, which claims the benefit of priority from Japanese Patent Application No. 2006-151570, filed May 31, 2006. The entire contents of each of the above-listed applications are incorporated herein by reference.

BACKGROUND OF THE INVENTION

1. Field of the Invention

The present invention relates to what is called an FIMS (front-opening interface mechanical standard) system that is used in transferring wafers housed in the interior of a transportation container called a pod between semiconductor processing apparatuses in semiconductor manufacturing process or the like. More particularly, the present invention relates to a load port apparatus used in an FIMS system having a door that is adapted to close/open a lid of a sealed container called an FOUP (front-opening unified pod) or pod in which wafers are housed and a small clean space (or mini-environment) in which a robot arm that transfers wafers into/from the pod is provided. The load port apparatus to which the present invention relates is adapted to prevent dust from entering the interior of the small clean space. The present invention also relates to a mini-environment system including such a load port apparatus and a semiconductor processing apparatus.

2. Related Background Art

In the past, the semiconductor manufacturing process had been performed in what is called a clean room constructed by establishing a high degree of cleanness in the room in which semiconductor wafers are handled. In recent years, however, in view of an increase in the wafer size and with a view to reduce cost incurred in maintenance of the clean room, a method of keeping clean only the interior of a processing apparatus, a pod (or wafer container) and a small space through which substrates or wafers are transferred between the pod and the processing apparatus has been used.

The pod is composed of a body portion of a substantially cubical shape having shelves provided therein that can hold a plurality of wafers in a parallel and separated state and an opening provided on one side thereof through which wafers can be brought into/out of it, and a lid for closing the opening. Those pods that have an opening portion provided not on the bottom but on one lateral side thereof (i.e. the front side to be opposed to the small space) are collectively called FOUP (front-opening unified pod). The present invention is mainly directed to technologies in which the FOUP is used.

A system provided with the above mentioned small space (mini environment) has a first opening opposed to the opening of the pod, a door for closing the first opening, a second opening provided on a semiconductor processing apparatus, and a transferring robot that is adapted to reach into the interior of the pod through the first opening to pick up a wafer and transfer it into the processing apparatus through the second opening. The system provided with the small space also has a support table that supports the pod in such a way that the pod opening is placed just in front of the door.

On the top face of the support table are positioning pins to be fitted into positioning holes provided on the bottom surface of the pod and a cramping unit adapted to engage with a portion to be cramped provided on the bottom surface of the pod to fix the pod to the support table. Typically, the support table is adapted to be movable toward and away from the door over a predetermined distance. When the wafers in a pod are to be transferred into the semiconductor processing apparatus, the support table on which the pod is placed moves toward the door until the lid of the pod comes into abutment with the door, and then after abutment, the lid is held and removed by the door, whereby the opening of the pod is opened. By this process, the interior of the pod and the interior of the processing apparatus are bought into communication with each other through the small space to allow wafer transferring operations that will be performed repeatedly. All of the support table, the door, the first opening, a mechanism for opening/closing the door and walls partly defining the small space and having the first opening are included in what is referred to as an FIMS system (front-opening interface system) or a load port apparatus. What is collectively referred to as a mini-environment system includes a load port apparatus, a pod and a semiconductor processing apparatus to which the load port apparatus is attached.

In such systems, generally, the pressure in the interior of the small space is designed to be higher than the pressure of the ambient space (which will be hereinafter referred to as the exterior space) to prevent dust or particles present in the exterior space from entering the interior of the small space. In other words, when the aforementioned first opening is open, a flow of air from the interior of the small space to the exterior space is generated so that dust or the like is always blown to the exterior space by the air flow. When the door is opened or closed, turbulence of air flow may occur near the first opening. Such turbulence of air flow may lead to entry of dust into the interior of the small space. To prevent such turbulence of air flow from occurring, in a load port apparatus disclosed in Japanese Patent Application Laid-Open No. 2002-373927 or Japanese Patent Publication No. 3581310, clearance is left around the door when the door is at the position for closing the first opening so that the interior of the small space and the exterior space are in communication with each other through the clearance.

The pressure in the interior of the small space is increased generally by introducing air from the exterior space into the interior of the small space using a fan provided in the upper portion of the small space. If the pressure difference between the interior of the small space and the exterior space becomes excessively large, there is a risk that entry of air into the pod or undesired turbulence of air flow may occur. In view of this, it is preferred that the pressure difference be kept small. Furthermore, it is preferred to keep the outflow of air from the small space constant while keeping the aforementioned small pressure difference. In the semiconductor manufacturing industry, the size of the wafers has been increased in recent years, and wafers having a diameter of 300 mm are to be processed. Accordingly, the volume of the small space has also been increased. Accordingly, in the case of the apparatus that uses a fan, it may become difficult to keep the aforementioned small pressure difference both in the relatively upstream position and relatively downstream position in the air flow and to keep the air flow rate constant. When the pressure difference is controlled to be small, the air flow condition in the clearance at the upper portion of the door in the upstream and that in the clearance at the lower portion of the door in the downstream may probably differ from each other, as discussed in Japanese Patent Application Laid-open No. 2002-373927.

SUMMARY OF THE INVENTION

The present invention has been made in view of the above described situations and has as an object to provide a dust resistant load port apparatus in which clearance through which a small space and the exterior space is in communication is left around the door that is in the position to close the first opening, and air flowing to the exterior space through the clearance around the door can be kept constant even when the pressure difference between the small space and the exterior space is small.

According to the present invention that is intended to achieve the above object, there is provided a load port apparatus comprising a chamber inside which the pressure is kept higher than the pressure of its exterior space, an opening portion defined by a chamber wall that constitutes the chamber through which the chamber and the exterior space are in communication with each other, and a door in the form of a plate that can rest at a position at which it substantially closes the opening portion, wherein the door leaves, when it rests at a position at which it substantially closes the opening portion, a clearance between outer circumferential surface of the door plate and an inner circumferential surface of the opening portion as the boundary surface with which the opening portion is defined by the chamber wall, and the area of the opening portion of the clearance that opens on a plane flush with the chamber side surface of the door or the chamber side surface of the chamber wall is larger than the area of the cross section of the clearance taken on a plane parallel to the plane.

According to the present invention that is intended to achieve the above object, there is also provided a load port apparatus annexed to a semiconductor processing apparatus to supply/remove a wafer to/from it, comprising, a chamber inside which the pressure is kept higher than the pressure of its exterior space, an opening portion defined by a chamber wall that constitutes the chamber through which the chamber and the exterior space are in communication with each other, and a door in the form of a rectangular plate that can rest at a position at which it substantially closes the opening portion, wherein the door leaves, when it rests at a position at which it substantially closes the opening portion, a clearance between outer circumferential surface of the door plate and an inner circumferential surface of the opening portion as the boundary surface with which the opening portion is defined by the chamber wall, and in a section of a region between the outer circumferential surface of the door and an inner circumferential surface of the chamber wall at the opening portion on at least one side of the rectangular door plate, the section being longer than a predetermined length along the side of the rectangular door plate, the slit width of the clearance at its opening portion on the chamber side is larger than the slit width of the clearance at its opening portion on the exterior space side.

In the load port apparatus according to the present invention, it is preferred that the aforementioned predetermined length be 120 mm or equal to 40% of the diameter of the wafer. It is also preferred that the aforementioned clearance vary continuously from its opening portion on the chamber side toward its opening portion on the exterior space side.

According to the present invention that is intended to achieve the above object, there is provided a mini-environment system comprising, a semiconductor processing apparatus, a pod that has an opening on one side thereof that can be opened/closed with a lid and houses the wafer, and the above described load port apparatus, wherein the load port apparatus includes a docking plate on which the pod is placed with the opening of the pod being directly opposed to the opening portion, and a door system adapted to retain said lid with said door to open/close the opening of said pod.

According to the present invention, even when the pressure difference between the chamber or the small space and the exterior space is small, gas flow from the small space to the exterior space through the clearance around the door can be kept stable. In other words, the flow speed of the gas flow can be kept constant, and the flow rate thereof can be kept stable.

When a gas flow is introduced into a slit that extends in the direction perpendicular to the gas flow, turbulence of gas flow occurs at the edge of the slit. This may result in instability of gas flow in the slit. The load port apparatus is generally equipped with a fan provided in the upper portion of the small space, and downward gas flow is generated in the small space by the fan. The upper section of the clearance on the upper side of the door and the lower section of the clearance on the lower side of the door constitute slits that extend perpendicularly to the gas flow generated by the fan. According to the present invention, the edge portions of the slits are designed to be tapered, whereby the angle of the edge portions, at which the gas flow is introduced into the slits, relative to the gas flow is made small. Thus, it is possible to reduce the possibility of generation of turbulence in the gas flow into the slits, and it is possible to make the flow rate of the gas flowing out through the clearance more stable.

DESCRIPTION OF THE PREFERRED EMBODIMENTS

Figure 1:
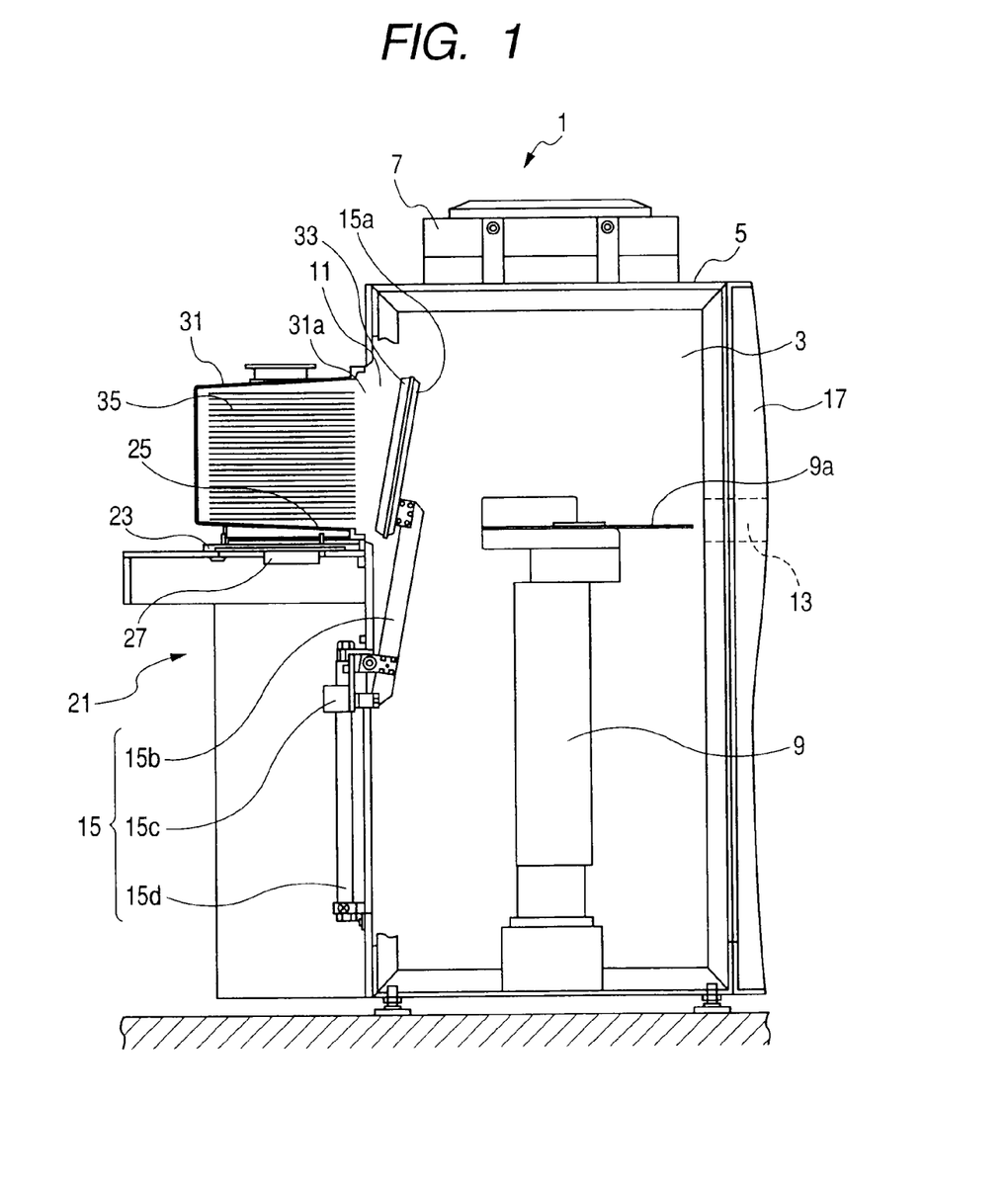
FIG. 1 is a side cross sectional view schematically showing a load port apparatus according to an embodiment of the present invention.

An embodiment of the present invention will be described in the following with reference to the accompanying drawings. FIG. 1 is a side cross sectional view schematically showing the structure of a load port apparatus 1 according to an embodiment of the present invention. The load port 1 has a housing 5 that defines a small space 3 and a pod support portion 21 disposed adjacent to the housing 5. On or in the housing 5 are provided a fan 7, a robot 9, a first opening 11, a second opening 13 and a door system 15. The fan 7 is provided on the housing 5 at the top of the small space 3. The fan 7 introduces gas (which is typically air) in the exterior space of the housing 5 into the interior of the small space 3. At the bottom of the housing 5 is a structure that allows gas to flow out of the housing 5. Dust or particulate generated in the interior of the small space 3 is brought by the gas flow to the exterior space through the bottom of the housing 5. The robot 9 has a robot arm 9a that can extend out of the small space through the first opening 11 and the second opening 13. The first opening 11 can be closed by the door 15a of the door system 15. The door 15a and the first opening 11 will be discussed in detail later. The second opening 13 opens to the interior of a wafer processing apparatus 17. Details of the wafer processing apparatus 17 do not have direct relevancy to the present invention, and the description thereof will be omitted from the specification.

The pod support portion 21 has a docking plate 23, a pod fixing system 25 and a docking plate driving system 27. The upper surface of the docking plate 23 is substantially flat, and a part of the pod fixing system 27 is disposed on the upper surface of the docking plate 23. A pod 31 like that described in the description of the background art is placed on the upper surface of the docking plate 23. The aforementioned part of the pod fixing system 27 has an engagement portion that is adapted to engage with a portion to be engaged (not shown) provided on the bottom surface of the pod 31 to fix the pod at a predetermined position on the docking plate 23. The docking plate 23 is arranged so that the opening 31a of the pod 31 placed in position on the upper surface of the docking plate 23 faces the aforementioned first opening 11 in alignment therewith. The docking plate driving system 27 is adapted to drive the pod 31 placed at the predetermined position together with the docking plate 23 toward and away from the first opening 11 using a guide rail and a driving cylinder that are not shown in the drawings.

Figure 2A:
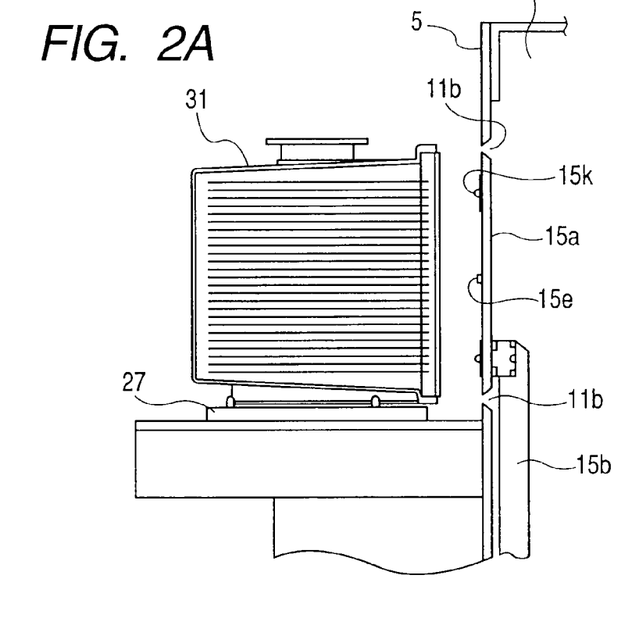
FIG. 2A is an enlarged schematic illustration of a portion near the door and the first opening of the load port apparatus shown in FIG. 1.
Figure 2B:
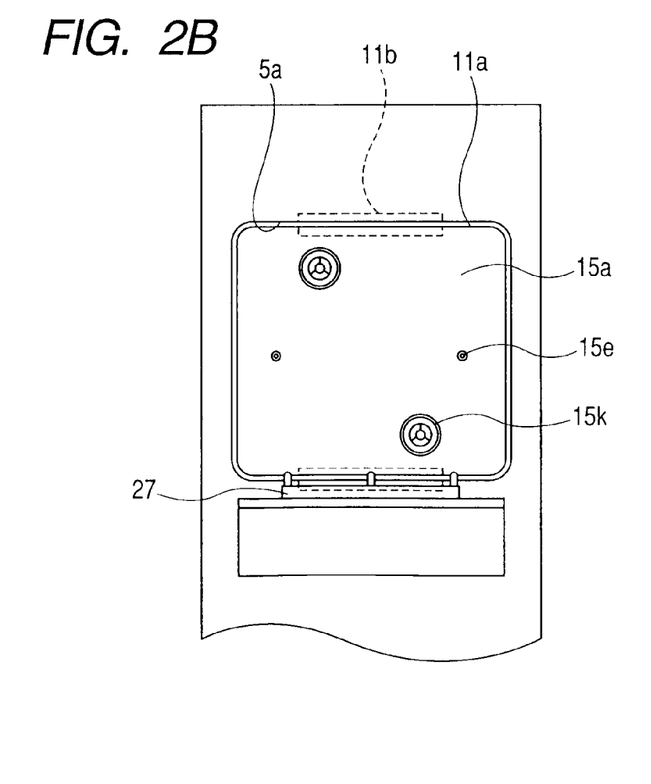
FIG. 2B illustrates the door and the first opening in the state shown in FIG. 1 as seen from the pod side.

On the external surface of the door 15a (i.e. the door surface that faces the pod 31) is an unlatch mechanism 15e (see FIGS. 2A and 2B). The unlatch mechanism 15e is adapted to engage with an associated structure (not shown) provided on the external surface of the lid 33 of the pod 31 and rotate so as to unlatch the latching mechanism with which the lid 33 is secured to the pod 31. On the door 15a is also provided a suction pad 15k that can suck the lid 33 with supply of negative pressure through piping (not shown) when it is in contact with the lid 33. With such suction, the lid 33 can be retained by the door 15a. The door system 15 includes a door arm 15b, a door opening/closing actuator 15c and a door elevator mechanism 15d. The door arm 15b is a rod like member that supports the door 15a at one end thereof. The other end of the door arm 15b is connected with the door opening/closing actuator 15c. The door arm 15b is rotatably supported at some position between the two ends so that it can swing about that position. When actuated by the door opening/closing actuator 15c, the door arm 15b swings about its rotation center, whereby the end of the door arm 15b and the door 15a supported by that end is moved away from or toward the first opening 11. The door elevator mechanism 15d supports the door opening/closing actuator 15c. The door elevator mechanism 15d has an elevator actuator that drives the actuator itself together with the door arm 15b supported thereon and the door 15a in the up and down directions along a guide that extends in the vertical direction.

In the following, the operation of the load port system 1 in an actual wafer processing process will be described. In the wafer processing process, a pod 31 filled with clean gas in which a predetermined number of wafers are housed is placed on the docking plate 23. When the pod 31 is placed on the docking plate 23, the pod fixing system 25 operates to set the pod 31 at a predetermined position relative to the docking plate 23. After that, the docking plate driving system 27 operates to move the pod 31 toward the first opening 11. During this operation, the door 15a is at rest at a position at which it substantially closes the first opening 11. The operation of the docking plate driving system 27 is stopped when the lid 33 of the pod 31 comes into abutment with the abutting surface of the door 15a and the docking plate 23 and the first opening 11 are brought into a predetermined positional relationship. At that time, the unlatching mechanism 15e operates to engage with the associated structure on the surface of the lid 33 and rotate, whereby the lid 33 becomes detachable from the pod 31. At the same time, the suction pad 15k sucks the lid 33, whereby the lid 33 is retained by the door 15a.

Then, the door opening/closing mechanism 15c starts to operates, whereby the door arm 15b is swung to move the door 15a that is retaining the lid 33 away from the first opening 11 to inside the small space 3. The swinging of the door arm 15b is stopped at a predetermined rotational angle, and thereafter the door elevator mechanism 15d starts to operate to move the door 15a downwardly together with the door opening/closing actuator 15c. By this series of operations, the first opening 11 is fully opened, and the small space 3 is brought into communication with the interior of the pod 31 through the first opening 11. In this state, the robot 9 starts to operate, namely transfer wafers 35 in the interior of the pod 31 to the wafer processing apparatus 17 through the second opening 13 using the robot arm 9a. While the above described state is maintained, the robot 9 also transfers the wafers that have been processed in the interior of the wafer processing apparatus 17 back to the pod 31.

Figure 2C:
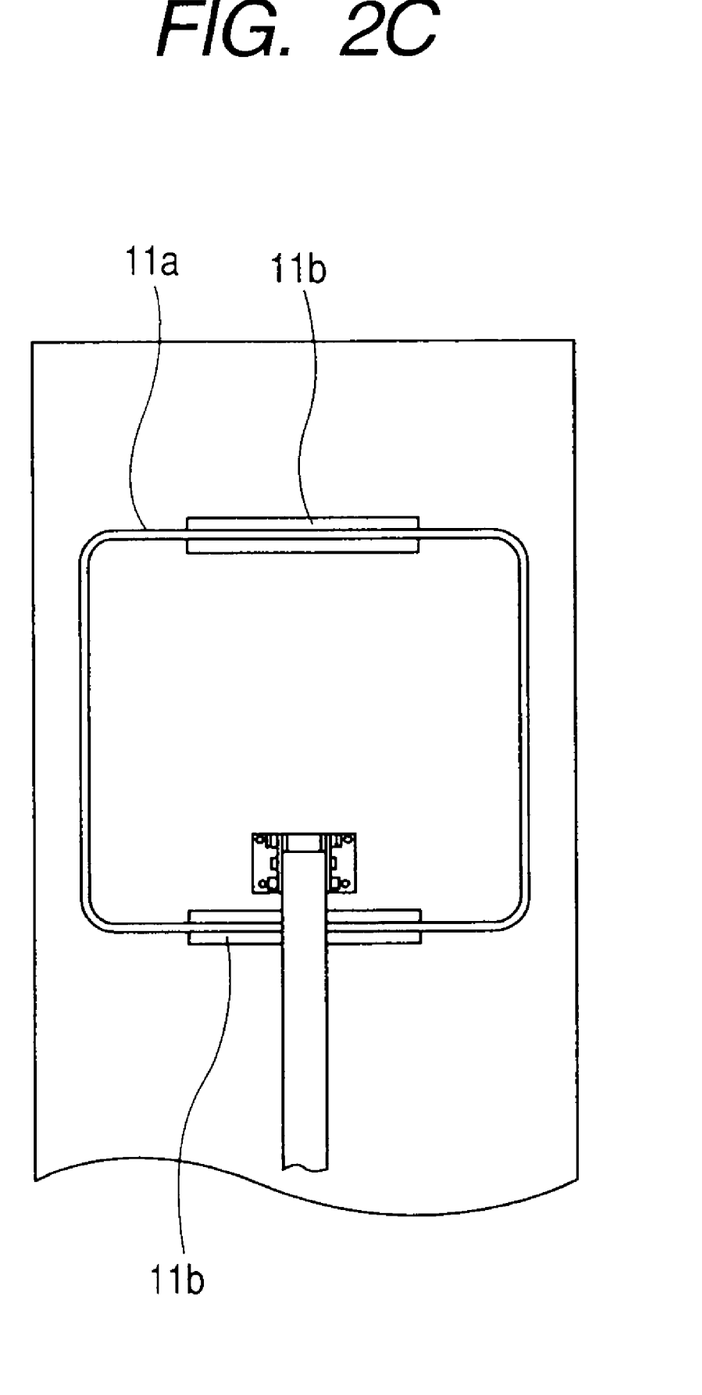
FIG. 2C illustrates the door and the first opening in the state shown in FIG. 1 as seen from the interior of the small space.

Characterizing features of the load port apparatus 1 according to the present invention having the above described structure will be described in the following with reference to some drawings. FIG. 2A is an enlarged view schematically showing the pod 33 and a portion near the first opening 11 of the load port apparatus illustrated in FIG. 1 where the door 15a is substantially closed. This is the state just after the pod 33 is placed on the docking plate drive system 27, and the pod 31 has not been moved toward the first opening 11 yet. FIG. 2B illustrates the first opening 11 in the state same as in FIG. 2A as seen from the position of the pod 33. In FIG. 2B, latch mechanisms 15e provided on the pod side surface of the door 15a can be seen. FIG. 2C illustrates the first opening 11 in the state same as in FIG. 2A as seen from the interior of the small space 3. In FIG. 2C, the door arm 15b provided in the small space 3 can be seen.

The projected area of the substantially flat region of the door 15a having a substantially rectangular plate-like shape is smaller than the area of the first opening 11, and the projected shape of the door 15a is a size smaller than the shape of the first opening 11. Therefore, when the door 15a is at a position for substantially closing the first opening 11, clearance 11a that allows fluid communication between the small space 3 and the exterior space is left around the door 15a. This clearance is a slit defined between the inner circumferential surface 5a of the first opening 11 by which the housing 5 defines the first opening 11 (i.e. the boundary surface of the housing wall 5 or chamber wall that limits the opening) and the outer circumferential surface of the door 15a with the slit length being determined by the thickness of the wall of the housing 5 and the thickness of the door 15a. In the conventional structures, the inner circumferential surface 5a of the opening that defines the first opening 11 and the outer circumferential surface of the door 15a are arranged to be parallel to each other. In the present invention, at least in a specific section of the inner circumferential surface 5a of the opening that defines the first opening 11 or the outer circumferential surface of the door 15a is shaped in such a way that the slit width is the largest at the position adjacent to the small space 3 and decreases from the small space 3 side toward the exterior space side. Here, the slit width refers to distance between the outer circumferential surface 15f of the door 15a and the inner circumferential surface 5a of the opening.

In the embodiment illustrated in FIGS. 2A to 2C, such portions with a varying slit width 11b are provided in the substantially central section of the upper slit and in the substantially central section of the lower slit. These portion of the slit are formed by cutting the edge along which the inner surface 5c of the housing wall 5b having the first opening 11 and the inner circumferential surface of the opening 11 meet by an angle of 45 degrees to form a tapered surface 5d connecting the inner (or small space side) surface 5c of the housing wall 5b and the inner circumferential surface 5a of the opening (see FIG. 6A). In the door 15a also, the edge along which the outer circumferential surface 15f of the door 15 and the inside (or small space side) surface 15g of the door 15 meet is cut at an angle of 45 degrees to form a tapered surface 15h connecting the outer circumferential surface 15f and the inside surface 15g of the door 15 (see FIG. 6A). In small space 3 of the load port apparatus, there is a gas flow that is perpendicular to the direction in which the slit extends (i.e. a gas flow parallel to the vertical direction in the drawings). According to the present invention, by providing regions in which the slit opening facing the gas flow is made large as is the case with this embodiment, a gas flow branching off from the aforementioned perpendicular gas flow and directed from the slit opening to the bottom (or the exterior side) of the slit can be easily produced. Such a branching gas flow is hardly produced, intrinsically, directly from the aforementioned perpendicular gas flow in conventional apparatuses. In addition, generation of turbulence at the edge of the slit upon branching of flow can be avoided since the direction of the branching gas flow is not perpendicular to the gas flow from which it originates in the region in which the branching of the gas flow occurs. Therefore, fluctuations of gas flow caused by turbulence at the slit edge, which are likely to occur in conventional apparatuses, can be eliminated, and stable branching flow can be produced.

Figure 3A:
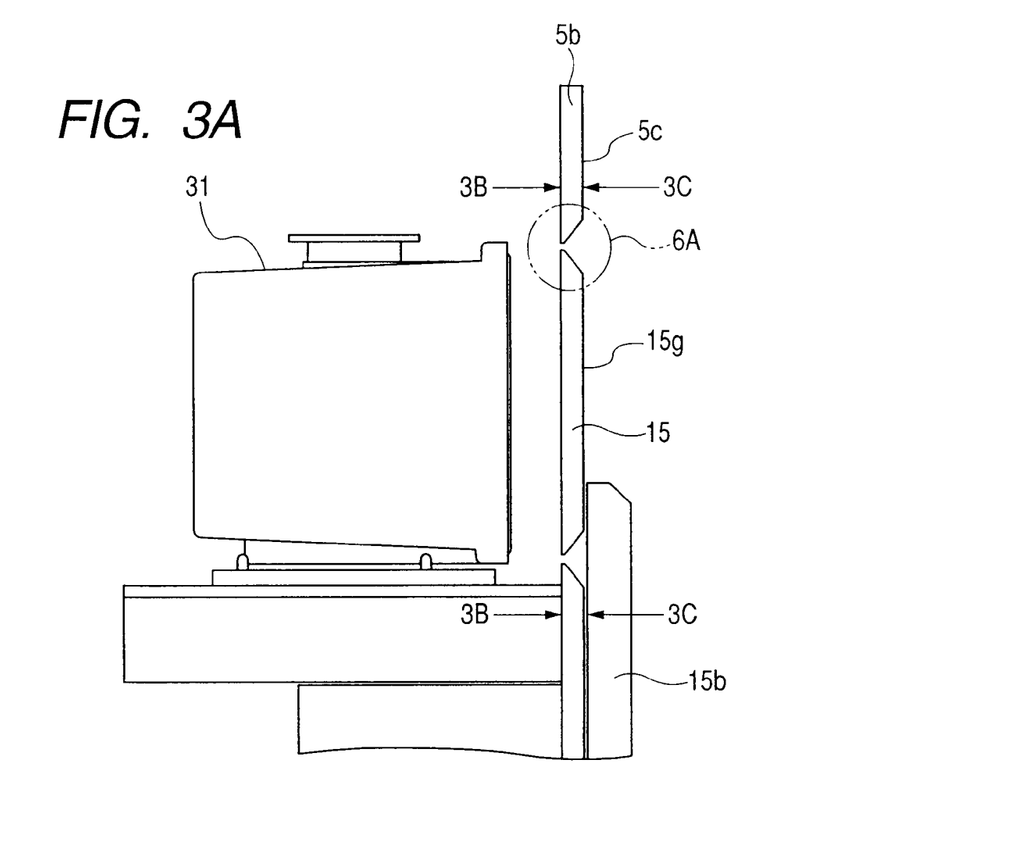
FIG. 3A is a schematic illustration of the portion near the door and the first opening shown in FIG. 2A.
Figure 3B:
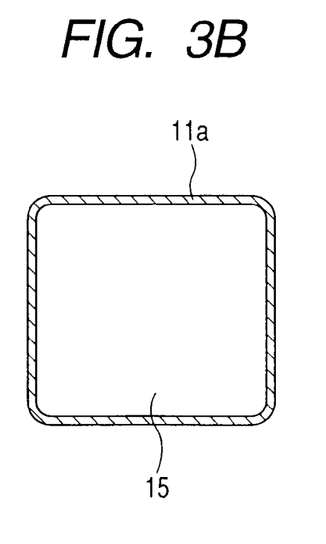
FIG. 3B schematically illustrates the portion illustrated in FIG. 3A as seen from the direction indicated by arrow 3B in FIG. 3A.
Figure 3C:
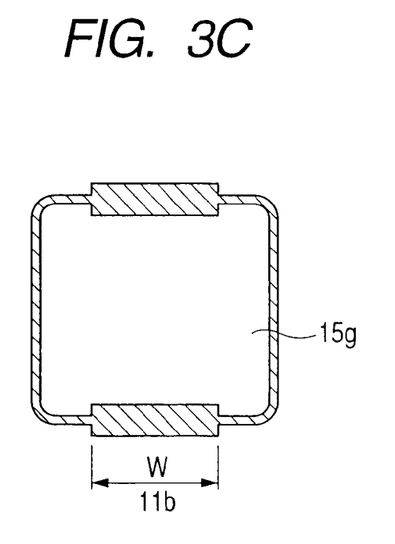
FIG. 3C schematically illustrates the portion illustrated in FIG. 3A as seen from the direction indicated by arrow 3C in FIG. 3A.

In the following, concrete characteristic configurations the load port apparatus according to the first embodiment of the present invention will be described in detail with reference to FIGS. 3A to 5. FIG. 3A illustrates the portion illustrated in FIG. 2A in a more simplified manner to facilitate explanation. FIG. 3B is a virtual illustration, as seen from the pod 33 side, of the clearance 11a that will open on the plane flush with the pod side surface of the door 15 (between the pod side surface of the door and the pod side surface of the housing wall) in the state shown in FIG. 3A in which the first opening 11 is substantially closed by the door 15. The clearance 11a having a substantially uniform width is left around the door 15. FIG. 3C is a virtual illustration, as seen from the small space 3 side, of the clearance 11a that will open on the plane flush with the inner surface of the door 15g (between the pod side surface of the door and the pod side surface of the housing wall) in the state shown in FIG. 3A. As shown in FIG. 3C, there are varying slit width sections 11b in which the length W (i.e. the dimension along each side of the first opening or the door plate). In these sections 11b, the width of the clearance (or slit) is increased.

According to the present invention, in the state in which the first opening of the load port apparatus is substantially closed by the door in the form of a plate, the area of the opening of the clearance on the plane flush with small space side of the door is designed to be larger than the area of the opening of the clearance on the plane flush with the pod side surface of the door. More specifically, as is also the case with the embodiment illustrated in FIG. 7B that will be described later, in the state in which the first opening is substantially closed by the door in the form of a flat plate, the total area of the opening of the clearance on the plane flush with the small space side surface of the door or the small space side surface of the housing wall that defines the first opening is designed to be larger than the total cross sectional area of the clearance on a plane parallel to but other than the aforementioned plane. By making the area of the opening of the clearance on the small space side large, it is possible to keep the flow rate and flow speed of the gas flowing out of the pod side opening of the clearance stable.

In this embodiment, the width of the clearance 11a or the distance between the outer circumferential surface 15f of the door 15 and the inner circumferential surface 5a of the opening on the housing wall 5b is designed to be 2 to 3 mm, and the tapered surfaces 5d, 15h are formed at an angle of 45 degrees. In order to cause gas flow to branch, it would be preferred that the width of the clearance be made large, since large clearance is advantageous in keeping the gas flow stable. However, if the clearance is too large, it will become difficult to maintain a slight pressure difference between the interior and the exterior of the small space, and when the fan is impaired ambient gas will be more likely to enter the small space 3 through the clearance. In view of these situations, the above mentioned range of the width of the clearance is selected. The taper angle is selected from the viewpoint of ease of machining. However, the values presented above are not intended to limit the present invention. The advantageous effects of the present invention are achieve as long as the above described condition concerning the area of the opening of the clearance is met, and the present invention covers various widths of the clearance and various taper angles.

Figure 4A:
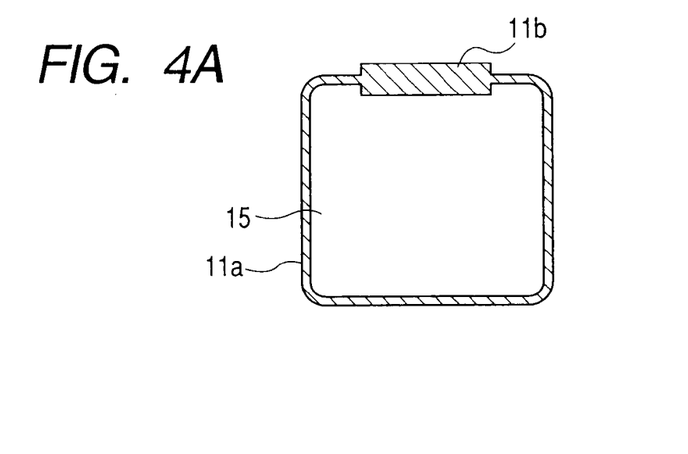
FIG. 4A schematically illustrates a varying slit width section provided on the upper side of the door according to another embodiment of the present invention.
Figure 4B:
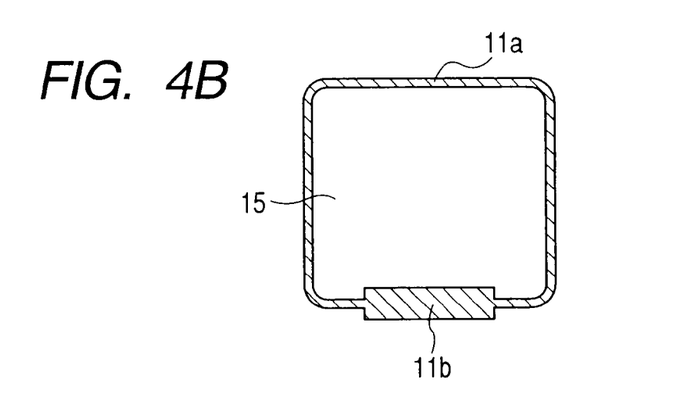
FIG. 4B schematically illustrates a varying slit width section provided on the lower side of the door according to another embodiment of the present invention.
Figure 4C:
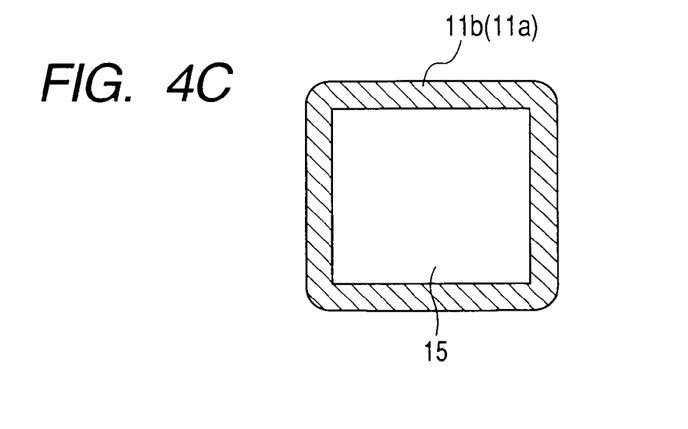
FIG. 4C schematically illustrates a varying slit width section provided all along the circumference of the door.

The present invention is not limited by the specific arrangement of varying slit width sections 11b shown in FIG. 3C, in which the varying slit width sections 11b having the same length are provided on the upper side and the lower side of the door 15a. FIGS. 4A to 4C show embodiments with different varying slit width sections 11b in the same manner as FIG. 3C. FIG. 4A shows an arrangement in which a varying slit width section 11b is provided only on the upper side of the door 15a. This arrangement is suitable when it is desired to form a stable air curtain of clean gas above the pod, for example when there is something that may possibly generate dust in the exterior of the load port apparatus. FIG. 4B shows an arrangement in which a varying slit width section 11b is provided only on the lower side of the door 15a. The clearance or slit on the lower side of the door 15a is most distant from the fan 7, and at that position the direction of gas flow is perpendicular to the direction in which the clearance extends unlike with the clearance on the lateral sides of the door 15a. Accordingly, gas is less likely to flow out through the clearance on the lower side under presence of a slight pressure difference. With the arrangement shown in FIG. 4B, gas can easily flow out through the clearance on the lower side of the door 15a. Thus, the gas flow rate and flow speed can be made stable in the region in which it is relatively difficult to make the gas flow rate stable. FIG. 4C shows an arrangement in which the clearance 11a is made as a varying slit width section 11b all along its length. This helps to make the flow rate and the flow speed of the outflowing gas more stable all along the clearance 11a.

We verified that in the case where a varying slit width section 11b is provided in a specific part of the slit (in particular in the upper and lower sides of the door 15a) as shown in FIGS. 4A and 4B, the gas flow from the small space 3 to the exterior space is made stable and deposition of dust onto wafers in the pod is reduced. However, it is necessary to determine the minimum value of the length (length designated by "W" in FIG. 3C) of the varying slit width section 11b to design an actual apparatus. We experimentally determined the minimum necessary length W by actually examining changes in the particle deposition ratio on a 300 mm silicon wafer while changing the length W. The result is shown in FIG. 5.

Figure 5:
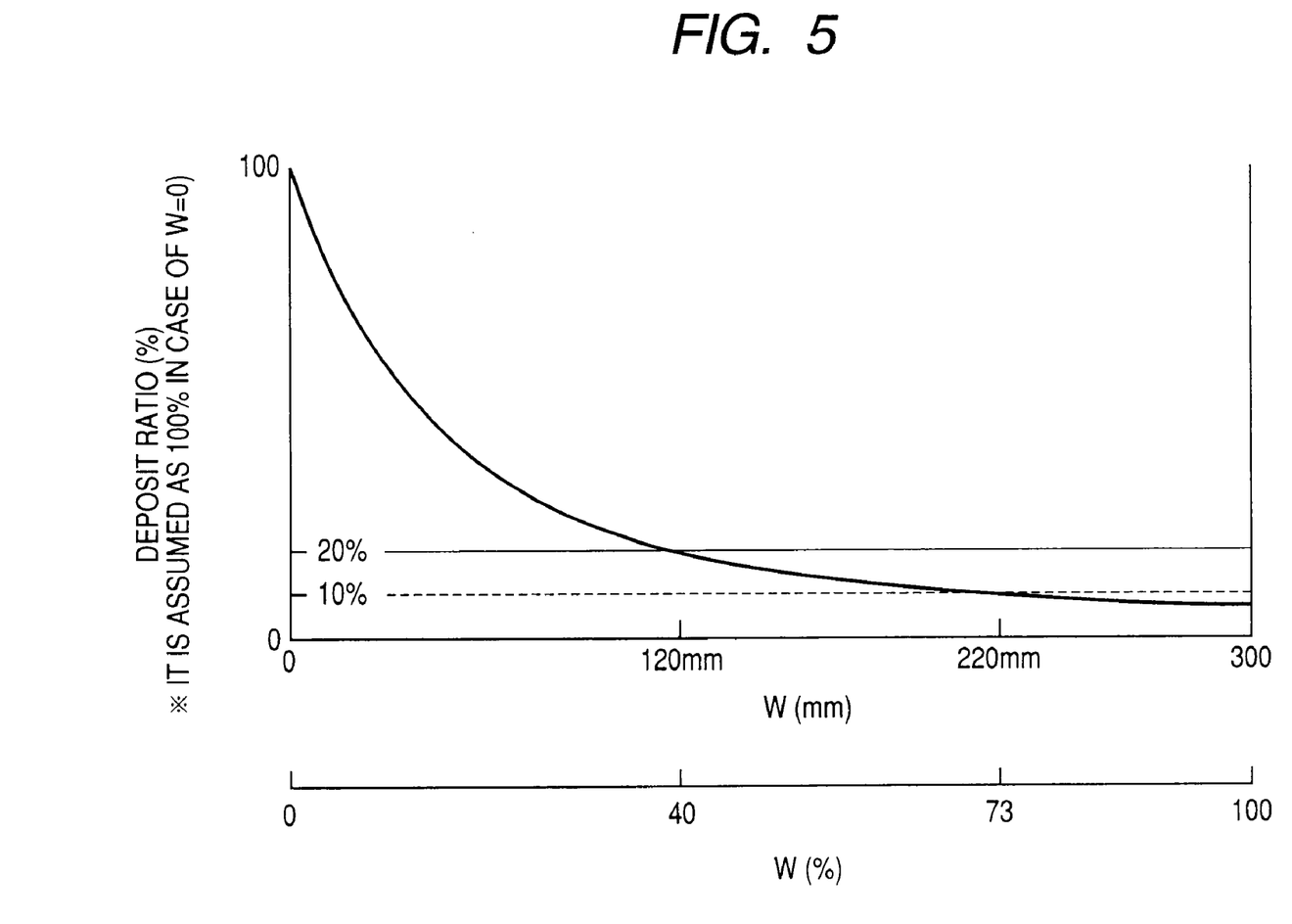
FIG. 5 is a graph showing changes in the deposition ratio of particle on a wafer with a change in the length of the varying slit width section provided at the position shown in FIG. 4B.

In FIG. 5, the horizontal axis represents the length W of the varying slit width section 11b provided on the lower side of the door 15a or the ratio of that length to the diameter of the wafer. The vertical axis represents the ratio (%) of the amount of the actually deposited particle or dust to the deposit amount in the case where no varying slit width section 11b is provided (i.e. length W=0) represented as 100%. As will be seen from FIG. 5, the particle deposition ratio decreased with an increase in the length W. Specifically, the dust deposition ratio was 20% when W=120 mm or W=40%, and the dust deposition ratio was 10% when W=220 mm or W=73%. This means that by increasing the length W of the varying slit width section, gas outflow from the clean small space 3 is made more stable, and it is possible to suppress deposition of particle or dust on the wafer surface more effectively. Particle deposition ratios lower than 20% will lead to a significant increase in the yield rate in the actual semiconductor manufacturing process. It will be appreciated that in the case of the manufacturing process using 300 mm wafers, it is possible to greatly enhance stability in the flow rate and flow speed of the gas flowing to the pod side through the clearance by providing a varying slit width section having a length W larger than 120 mm, more preferably larger than 220 mm. The size of the first opening 11 and the size of the door 15a will be changed depending on the size of the wafer used. However, a similar advantageous effect can be achieved by making the length W larger than 40% of the wafer diameter, more preferably larger than 73% of the wafer diameter, as will be easily understood.

As discussed before, the clearance 11a on the lateral sides of the door 15a extends substantially parallel to the direction of gas flow generated by the fan 7. Therefore, gas flow passing through the clearance 11a can be relatively easily produced from the gas flow generated by the fan even if the depth of the slot 11a is relatively large. Gas flow in the clearance 11a provided on the upper side of the door 15a is relatively difficult to be produced, since the depth direction of that section of the clearance 11a is perpendicular to the direction of the gas flow generated by the fan. However, since that section of the clearance is located closest to the fan 7, an apparent pressure difference between the upstream and the downstream of the clearance 11a can be easily produced. Therefore, the gas flow can be made stable so long as it is possible to maintain a significant pressure difference. However, the clearance 11a on the lower side of the door 15a is in adverse conditions, as compared to the other portions of the clearance 11a, in terms of both the depth direction of the clearance and the distance from the fan 7, and it is considered to be most difficult to make the gas flow in that section of the clearance stable. In view of the above situations, the varying slit width section 11b should be provided, most preferably, on the lower side of the door 15a, and secondly on the upper side, and may further be provided on the lateral sides if need be.

Figure 6A:
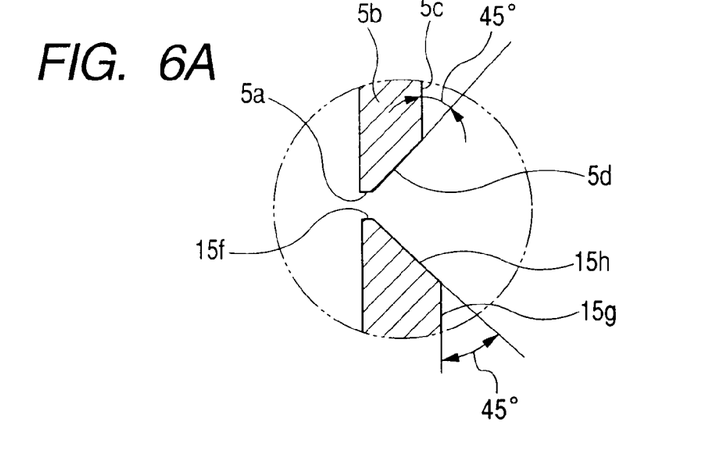
FIG. 6A is an enlarged view of portion 6A in FIG. 3A.
Figure 6B:
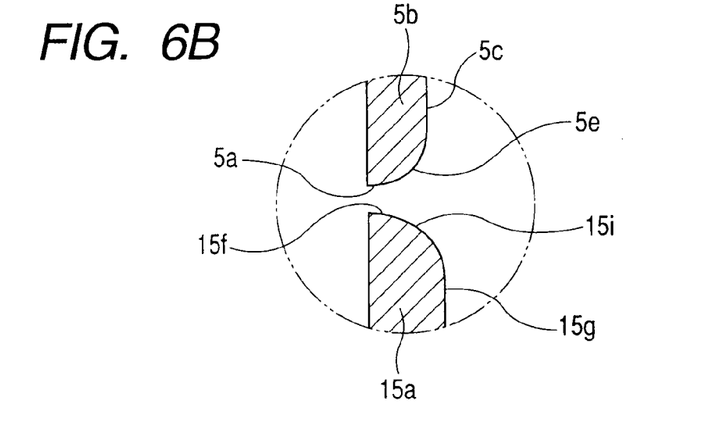
FIG. 6B illustrates a cross sectional shape of a varying slit width section according to another embodiment of the present invention.

In the above described embodiment, the slit width is varied by forming a tapered surface 5d with a predetermined taper angle that connects the inner surface of the housing wall 5c and the inner circumferential surface 5a of the first opening and a tapered surface 15h with a predetermined taper angle that connects the small space side surface 15g of the door 15a and the outer circumferential surface 15f of the door 15a, as shown in FIG. 6A. FIG. 6A is an enlarged cross sectional view showing the encircled portion 6A in FIG. 3A, which shows a varying slit width portion in cross section taken on a plane perpendicular to the plane on which the clearance extends. The present invention is not limited to this particular feature. As shown in FIG. 6B that shows the variation in the slit width in a similar manner as FIG. 6A, for example, the slit width may be varied by forming a curved surface 5e that smoothly connects the inner surface 5c of the housing wall and the inner circumferential surface 5a of the first opening and a curved surface 15i that connects the small space side surface 15g of the door 15a and the outer circumferential surface 15f of the door 15a.

Figure 7A:
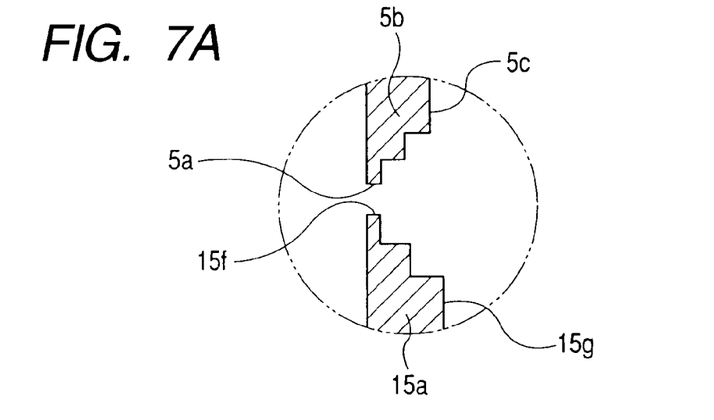
FIG. 7A illustrates a cross sectional shape of a varying slit width section according to another embodiment of the present invention.
Figure 7B:
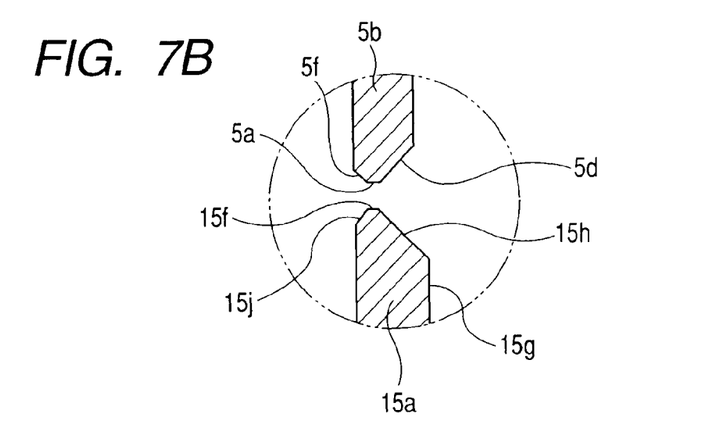
FIG. 7B illustrates a cross sectional shape of a varying slit width section according to another embodiment of the present invention.

Furthermore, as shown in FIG. 7A similar to FIG. 6A, the tapered surface 5d and 15h may be replaced by a plurality of flat surfaces. In this case, specifically, the tapered surface 5d is replaced by a plurality of surfaces parallel to the inner circumferential surface 5a of the first opening and a plurality of surfaces parallel to the inner surface 5c of the housing wall that are arranged alternately. Similarly, the tapered surface 15h is replaced by a plurality of surfaces parallel to the outer circumferential surface 15f of the door 15a and a plurality of surfaces parallel to the inside surface 15g of the door 15a arranged alternately. As shown in FIG. 7B similar to FIG. 6A, an external tapered portion 5f that connects the inner circumferential surface 5a of the first opening and the outer surface of the housing wall and an external tapered portion 15j that connects the outer circumferential surface 15f of the door 15a and the outside surface of the door 15a may be provided.

For various reasons such as that it is considered preferable that the small space 3 be kept in a substantially unchanging pressure condition irrespective of operations of opening and closing the door 15a, the small space 3 is kept in communication with the exterior space even when the door is closed, and a slight pressure difference is maintained between the upstream and downstream of the slit (or clearance 11a). The flow rate of the gas through the slit is generally determined by the product of the pressure difference between the upstream and downstream of the slit and the exhaust resistance. In the case of the load port to which the present invention is applied, in order to keep dust away from the wafers using gas flowing out through the slit, it is considered preferable that the flow rate of the outflowing gas through the slit be made higher. Accordingly, it is preferred that the exhaust resistance of the clearance 11a be decreased especially in the section in which it is difficult to make the gas flow rate high. An easy way of reducing the exhaust resistance is to enlarge the slit width or shorten the length of the narrow slit width section. As shown in FIG. 7A or FIG. 7B, by making the section in which the clearance 11a is defined by the inner circumferential surface 5a of the first opening and the outer circumferential surface 15f of the door 15a short, it is possible to adjust the exhaust resistance of the varying slit width section suitably. In other words, by using the arrangement shown in FIG. 6A and the arrangement shown in FIG. 7A or FIG. 7B in an appropriate combination on the upper and lower sides or on the lateral sides, or on all the upper, lower and lateral sides, it is possible to establish more uniform gas flow conditions all along the circumference of the door 15a.

Figure 8A:
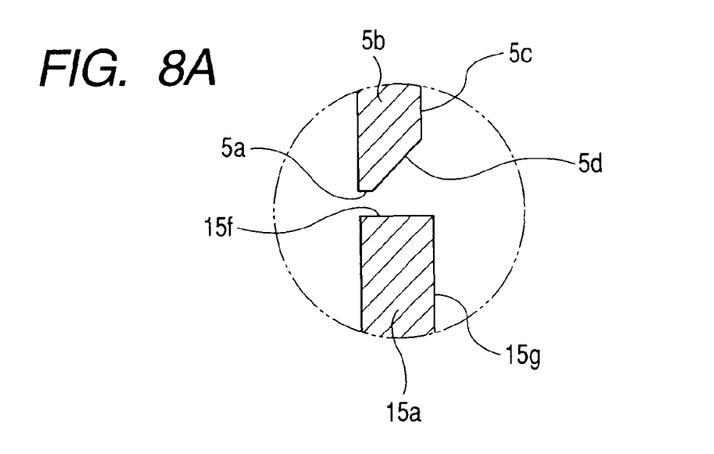
FIG. 8A illustrates a cross sectional shape of a varying slit width section according to another embodiment of the present invention.
Figure 8B:
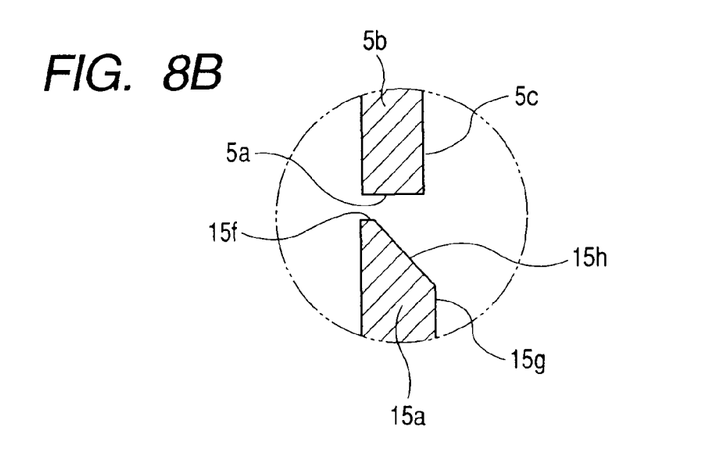
FIG. 8B illustrates a cross sectional shape of a varying slit width section according to another embodiment of the present invention.

Although in the above described embodiment tapered surfaces are provided on both the housing wall 5 and the door 15a, the present invention is not limited to this. As shown in FIG. 8A that is similar to FIG. 6A, a tapered surface the same as the above described tapered surface 5d may be provided only on the housing wall 5b. Alternatively, a tapered surface the same as the above described tapered surface 15h may be provided only on the door 15a as shown in FIG. 8B that is similar to FIG. 6A. The advantageous effects of the present invention are achieved sufficiently only by making the width of the opening of the clearance 11a on the small space 3 side larger by tapering or the like and making the length of the section of the clearance having the narrowest width short. With the opening that is widened by tapering or the like, the clearance opens at an acute angle with the gas flow generated by the fan. This makes entry of gas flow into the clearance easier. In addition, by making the section of the clearance having the narrowest width shorter by tapering or the like, it is possible to reduce the exhaust resistance in that section of the clearance thereby making the gas flow rate therethrough larger.

What is claimed is:

1. A load port apparatus comprising:
   a chamber configured to maintain a higher pressure of a space interior to the chamber than a pressure of a space exterior to the chamber;
   an opening portion defined by a chamber wall of the chamber, the opening portion creating a passage between the space interior to the chamber and the space exterior to the chamber;
   a fan located at an upper side of the chamber that generates a first flow of air in the downward direction of the chamber; and
   a door comprising a plate configured to rest at a position at which it substantially closes the opening portion and forming a clearance between an outer circumferential surface of the plate and an inner circumferential surface of the opening portion, wherein an area of an interior cross section of said clearance between the plate and the opening portion on a plane flush with an interior side of the chamber is larger than an area of an exterior cross section of the clearance between the plate and the opening portion on a plane flush with an exterior of the chamber, and wherein the clearance generates a second flow of air from the area of the interior cross section of the clearance to the area of the exterior cross section of the clearance, the second flow of air being separated from the first flow of air and flowing in a direction different from the direction of the first flow of air, and the second flow of air being generated by the difference in the area of the interior cross section of the clearance and the area of the exterior cross section of the clearance.

2. A load port apparatus annexed to a semiconductor processing apparatus to supply a wafer to or remove a wafer from the semiconductor processing apparatus, comprising:
   a chamber configured to maintain a higher pressure of a space interior to the chamber than a pressure of a space exterior to the chamber;
   an opening portion defined by a chamber wall of the chamber, the opening portion creating a passage between the space interior to the chamber and the space exterior to the chamber;
   a fan located at an upper side of the chamber that generates a first flow of air in the downward direction of the chamber; and
   a door comprising a rectangular plate configured to rest at a position at which it substantially closes the opening portion and forming a clearance between an outer circumferential surface of the rectangular plate and an inner circumferential surface of the opening portion, wherein an interior width of the clearance at a side of the space interior to the chamber is larger than an exterior width of the clearance at a side of the space exterior to the chamber, in a region longer than a predetermined length located along at least one side of the outer circumferential surface of the rectangular plate, and wherein the clearance generates a second flow of air from the space interior to the chamber to the space exterior to the chamber, the second flow of air being separated from the first flow of air and flowing in a direction different from the direction of the first flow of air, and the second flow of air being generated by the difference between the interior width of the clearance and the the exterior width of clearance.

3. A load port apparatus according to claim 2, wherein the predetermined length is 120 mm.

4. A load port apparatus according to claim 2, wherein the predetermined length is equal to 40% of the diameter of the wafer.

5. A load port apparatus according to claim 2, wherein the difference between the interior width of the clearance and the exterior width of the clearance varies continuously from the side of the space interior to the chamber to the side of the space exterior to the chamber.

6. A load port apparatus annexed to a semiconductor processing apparatus to supply a wafer to or remove a wafer from the semiconductor processing apparatus, comprising:
   a chamber configured to maintain a higher pressure of a space interior to the chamber than a pressure of a space exterior to the chamber;
   an opening portion defined by a chamber wall of the chamber, the opening portion creating a passage between the space interior to the chamber and the space exterior to the chamber;
   a fan located at an upper side of the chamber that generates a first flow of air in the downward direction of the chamber; and
   a door comprising a rectangular plate configured to rest at a position at which it substantially closes the opening portion and forming a clearance between an outer circumferential surface of the rectangular plate and an inner circumferential surface of the opening portion, wherein at least one side of the outer circumferential surface of the rectangular plate is tapered to form a tapered surface such that an area of an interior cross section of said clearance between the one side and the opening portion on a plane flush with an interior side of the chamber is larger than an area of an exterior cross section of the clearance between the one side and the opening portion on a plane flush with an exterior of the chamber, the tapered surface being in a region longer than a predetermined length located along at least one side of the outer circumferential surface of the rectangular plate, and wherein the clearance generates a second flow of air from the space interior to the chamber to the space exterior to the chamber, the second flow of air being separated from the first flow of air and flowing in a direction different from the direction of the first flow of air, and the second flow of air being generated by the tapered surface of the outer circumferential surface of the rectangular plate at the side of the space interior to the chamber.

7. A load port apparatus according to claim 6, wherein the predetermined length is 120 mm.

8. A load port apparatus according to claim 6, wherein the predetermined length is equal to 40% of the diameter of the wafer.

9. A load port apparatus according to claim 6, wherein a width of the clearance varies continuously from a side of the inner space of the chamber to a side of the space exterior to the chamber.

10. A load port apparatus annexed to a semiconductor processing apparatus to supply a wafer to or remove a wafer from the semiconductor processing apparatus, comprising:

a chamber configured to maintain a higher pressure of a space interior to the chamber than a pressure of a space exterior to the chamber;

an opening portion defined by a chamber wall of the chamber, the opening portion creating a passage between the space interior to the chamber and the space exterior to the chamber;

a fan located at an upper side of the chamber that generates a first flow of air in the downward direction of the chamber; and a door comprising a rectangular plate configured to rest at a position at which it substantially closes the opening portion and forming a clearance between an outer circumferential surface of the rectangular plate and an inner circumferential surface of the opening portion, wherein at least one side of one of the outer circumferential surface of the rectangular plate and of the inner circumferential surface of the opening portion has a tapered surface such that an area of an interior cross section of said clearance between the one side and the opening portion on a plane flush with an interior side of the chamber is larger than an area of an exterior cross section of the clearance between the one side and the opening portion on a plane flush with an exterior of the chamber, the tapered surface being in a region longer than a predetermined length located along at least one side of the outer circumferential surface of the rectangular plate, and wherein the clearance generates a second flow of air from the space interior to the chamber to the space exterior to the chamber, the second flow of air being separated from the first flow of air and flowing in a direction different from the direction of the first flow of air, and the second flow of air being generated by the tapered surface of the inner circumferential surface of the opening portion at the side of the space interior to the chamber.

* * * * *